US009064983B2

(12) United States Patent
Izuha et al.

(10) Patent No.: US 9,064,983 B2
(45) Date of Patent: *Jun. 23, 2015

(54) SOLID-STATE IMAGING DEVICE AND ELECTRONIC EQUIPMENT

(71) Applicant: Sony Corporation, Tokyo (JP)

(72) Inventors: Kyoko Izuha, Kanagawa (JP); Kouichi Harada, Kanagawa (JP)

(73) Assignee: SONY CORPORATION (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/272,332

(22) Filed: May 7, 2014

(65) Prior Publication Data

US 2014/0240557 A1    Aug. 28, 2014

Related U.S. Application Data

(63) Continuation of application No. 13/089,539, filed on Apr. 19, 2011, now Pat. No. 8,754,968.

(30) Foreign Application Priority Data

May 20, 2010    (JP) ................................ 2010-115935

(51) Int. Cl.
```
H04N 9/083      (2006.01)
H01L 31/0216    (2014.01)
H04N 5/225      (2006.01)
H04N 9/04       (2006.01)
H01L 27/146     (2006.01)
```
(52) U.S. Cl.
CPC ........ *H01L 31/02162* (2013.01); *H04N 5/2254* (2013.01); *H04N 9/045* (2013.01); *H04N 2209/045* (2013.01); *H01L 27/14625* (2013.01)

(58) Field of Classification Search
USPC ......... 348/266–268, 271–273, 275–277, 279, 348/290
See application file for complete search history.

(56) References Cited

U.S. PATENT DOCUMENTS 5,581,300 A * 12/1996 Kim .............................. 348/297
6,476,865 B1 * 11/2002 Gindele et al. ................ 348/277

OTHER PUBLICATIONS

Yuta Kishimoto and Jiro Abe, "A Fast Photochromic Molecule That Colors Only under UV Light", published on the Internet on Mar. 10, 2009, American Chemical Society.*

* cited by examiner

*Primary Examiner* — Sinh Tran
*Assistant Examiner* — Mark Monk
(74) *Attorney, Agent, or Firm* — Sheridan Ross P.C.

(57) ABSTRACT

A solid-state imaging device includes: a semiconductor substrate having a light receiving surface sectioned for red, green, blue, and white pixels arranged in a matrix with photodiodes formed thereon; color filters formed on the semiconductor substrate in light incident paths to the photodiodes of the respective formation regions of the red, green, and blue pixels and respectively transmitting lights in red, green, and blue wavelength regions; and photochromic films formed on the semiconductor substrate in the light incident path to the photodiodes in the formation regions of at least some of the white pixels, and containing a photochromic material having light transmittance varying in response to incident light intensity in a predetermined wavelength region, wherein a half period of the light transmittance of the photochromic films is shorter than one frame as a period in which pixel signals obtained in the pixels are read out with respect to all pixels.

18 Claims, 10 Drawing Sheets

R1,R2···RED PIXELS
G1,G2···GREEN PIXELS
B1,B2···BLUE PIXELS
W1,W2···WHITE PIXELS
CS1,CS2···SETS OF PIXELS

SOLID-STATE IMAGING DEVICE AND ELECTRONIC EQUIPMENT

CROSS-REFERENCE TO RELATED APPLICATIONS

This application is a continuation of U.S. patent application Ser. No. 13/089,539, filed Apr. 19, 2011, which claims priority to Japanese Patent Application Serial No. JP 2010-115935, filed in the Japan Patent Office on May 20, 2010, the entire disclosures of which are hereby incorporated herein by reference.

BACKGROUND OF THE INVENTION

1. Field of the Invention

The present invention relates to a solid-state imaging device, a manufacturing method and a design method thereof, and electronic equipment, and specifically, to a solid-state imaging device having color filters of R (red), green (G), and blue (B), a manufacturing method and a design method thereof, and electronic equipment.

2. Background Art

Electronic equipment such as digital video electronic equipment or digital still electronic equipment has a solid-state imaging device including a CCD (Charge Coupled Device) image sensor and a CMOS (Complementary Metal-Oxide-Silicon Transistor) image sensor, for example.

In the solid-state imaging device, plural pixels are arranged in a matrix in the horizontal direction and the vertical direction on a semiconductor substrate, and form a light receiving surface. On the light receiving surface, sensors as photoelectrically conversion parts such as photodiodes are provided for the respective pixels.

On the light receiving surface, a light focusing structure for focusing light according to an object image on the sensors of the respective pixels is formed, signal charge is generated by receiving the light according to the object image and photoelectrically converting the received light, and thereby, pixel signals are obtained.

In the CCD, CMOS image sensors in related art, the light entering the sensor part is photoelectrically converted by the photodiode, the incident light is converted into electric charge, and a video signal is obtained. Such a device has a structure in which the light entering in a fixed exposure time is converted into electric charge and accumulated.

Since the amount of accumulated electric charge is finite, for example, when strong light enters, the electric charge is saturated and a white and black gradation becomes insufficient. That is, there is a range of an amount of incident light for the solid-state imaging device to obtain appropriate output signals, and the range is very narrow compared to that of an imaging target.

Accordingly, a technology of expanding the dynamic range of the solid-state imaging device is desired.

As dynamic range expansion technologies in related art, Non-Patent Document 1 (2005 IEEE Workshop on Charge-Coupled Devices and Advanced Image Sensors P.169, P.173) discloses a technology of changing intervals of photoelectric conversion in response to amounts of incident light. Further, Patent Document 1 (JP-A-2008-167004) discloses a method of setting gain in response to amounts of incident light.

Furthermore, Patent Document 2 (JP-A-2006-333439) discloses a solid-state imaging device having a light blocking member that blocks a photoelectric conversion part from light and an actuator that drives the light blocking member using MEMS.

In addition to the methods of expanding the dynamic range by the device configuration, there are proposals to realize the dynamic range expansion technology using materials.

Further, Patent Document 3 (JP-A-1-248542) and Patent Document 4 (JP-A-10-65129) disclose methods of expanding a dynamic range by applying a material on a surface of glass of a case part of a solid-state imaging device or inserting a material between the glass surface and the solid-state imaging device for photochromic control.

Furthermore, Patent Document 5 (JP-A-1-236649) discloses a method of expanding a dynamic range by forming a film of a material at the upstream of the sensor part for photochromic control.

Moreover, Patent Document 6 (JP-A-4-65163) discloses a method of applying a photochromic reaction material to the outer side of a photodiode.

As a problem hard to be solved in related art technologies, there are time lags at moving picture imaging and continuous imaging.

That is, in a technique using a readout system, time lags are caused at plural readouts and long and short electric charge accumulation, and, in a technique using a mechanical shutter, time lags are caused depending on positions. Accordingly, it may be impossible to completely remove unnaturalness as images.

On the other hand, regarding the technology of expanding the dynamic range by materials, there are problems that transmittance has wavelength dependence and a reaction rate of the photochromic reaction does not satisfy specifications determined by the signal processing speed of the existing solid-state imaging device. Thus, it has been difficult to use the technology for the solid-state imaging device.

SUMMARY OF THE INVENTION

It is desirable to expand a dynamic range without generating unnaturalness as images, which has been difficult to solve in the solid-state imaging devices according to the related art technologies.

A solid-state imaging device according to an embodiment of the invention includes a semiconductor substrate having a light receiving surface sectioned for red pixels, green pixels, blue pixels, and white pixels arranged in a matrix with photodiodes formed thereon, color filters formed on the semiconductor substrate in light incident paths to the photodiodes of the respective formation regions of the red pixels, the green pixels, and the blue pixels and respectively transmitting lights in red, green, and blue wavelengths, and photochromic films formed on the semiconductor substrate in the light incident paths to the photodiodes of the formation region of at least some of the white pixels, and containing a photochromic material having light transmittance varying in response to incident light intensity in a predetermined wavelength region, wherein a half period of the light transmittance of the photochromic films is shorter than one frame as a period in which pixel signals obtained in the pixels are read out with respect to all pixels.

In the solid-state imaging device according the embodiment of the invention, the photodiodes are formed in sections of the red pixels, the green pixels, the blue pixels, and the white pixels arranged in the matrix on the substrate.

In the light incident paths to the photodiodes of the respective formation regions of the red pixels, the green pixels, and the blue pixels, the color filters that respectively transmit lights in red, green, and blue wavelength regions may be formed on the semiconductor substrate.

In the light incident paths to the photodiodes in the formation regions of at least some of the white pixels, the photochromic films containing the photochromic material having light transmittance varying in response to incident light intensity in the predetermined wavelength region may be formed on the semiconductor substrate.

Here, the half period of the light transmittance of the photochromic films is shorter than one frame as the period in which pixel signals obtained in the pixels are read out with respect to all pixels.

Electronic equipment according to another embodiment of the invention includes a solid-state imaging device, and optical system that guides incident light to an imaging unit of the solid-state imaging device, and a signal processing circuit that processes an output signal of the solid-state imaging device, the solid-state imaging device including a semiconductor substrate having a light receiving surface sectioned for red pixels, green pixels, blue pixels, and white pixels arranged in a matrix with photodiodes formed thereon, color filters formed on the semiconductor substrate in light incident paths to the photodiodes of the respective formation regions of the red pixels, the green pixels, and the blue pixels and respectively transmitting lights in red, green, and blue wavelengths, and photochromic films formed on the semiconductor substrate in the light incident paths to the photodiodes of the formation region of at least some of the white pixels, and containing a photochromic material having light transmittance varying in response to incident light intensity in a predetermined wavelength region, wherein a half period of the light transmittance of the photochromic films is shorter than one frame as a period in which pixel signals obtained in the pixels are read out with respect to all pixels.

The electronic equipment according to the embodiment of the invention has the solid-state imaging device, the optical system that guides incident light to the imaging unit of the solid-state imaging device, and the signal processing circuit that processes the output signal of the solid-state imaging device.

Here, in the solid-state imaging device, the photodiodes are formed in sections of the red pixels, the green pixels, the blue pixels, and the white pixels arranged in the matrix on the semiconductor substrate.

In the light incident paths to the photodiodes of the respective formation regions of the red pixels, the green pixels, and the blue pixels, the color filters that respectively transmit lights in red, green, and blue wavelength regions may be formed on the semiconductor substrate.

In the light incident paths to the photodiodes in the formation regions of at least some of the white pixels, the photochromic films containing the photochromic material having light transmittance varying in response to incident light intensity in the predetermined wavelength region may be formed on the semiconductor substrate.

Here, the half period of the light transmittance of the photochromic films is shorter than one frame as the period in which pixel signals obtained in the pixels are read out with respect to all pixels.

According to the solid-state imaging device of the embodiment of the invention, the dynamic range may be expanded without generation of unnaturalness as images using the photochromic material having the half period shorter than one frame in the white pixels.

According to the electronic equipment of the embodiment of the invention, the dynamic range may be expanded without generation of unnaturalness as images using the photochromic material having the half period shorter than one frame in the white pixels of the solid-state imaging device to be mounted.

DESCRIPTION OF PREFERRED EMBODIMENTS

As below, embodiments of solid-state imaging devices and electronic equipment of the invention will be explained with reference to the drawings.

Figure 1A:
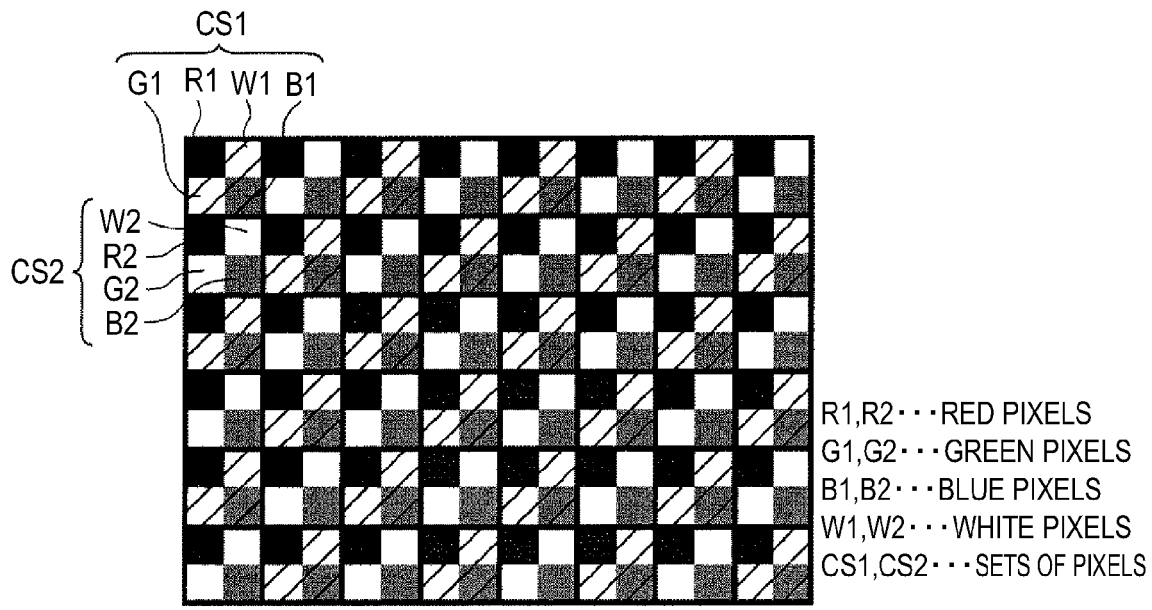
FIG. 1A is a schematic plan view showing a layout of a solid-state imaging device according to a first embodiment of the invention.

The explanation will be made in the following order.
1. First Embodiment (configuration having photochromic films on white pixels)
2. Second Embodiment (layout of photochromic films with respect to pixels)
3. Third Embodiment (layout of photochromic films with respect to pixels when only white pixels have photochromic films)
4. Fourth Embodiment (layout of photochromic films with respect to pixels when only white pixels have photochromic films)
5. Fifth Embodiment (configuration having light amount measurement part)
6. Six Embodiment (application to electronic equipment)<
<First Embodiment>
[Configuration of Solid-State Imaging Device]
FIG. 1A is a schematic plan view showing a layout of a solid-state imaging device according to the first embodiment of the invention, and FIGS. 1B and 1C are partially enlarged views.

In the embodiment, the device has sets of pixels CS1 each including a red pixel R1, a green pixel G1, a blue pixel B1, and a white pixel W1 with photochromic film and sets of pixels CS2 each including a red pixel R2, a green pixel G2, a blue pixel B2, and a white pixel W2 without photochromic film.

Figure 1B:
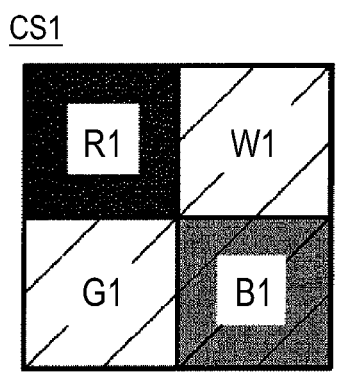
FIGS. 1B and 1C are partially enlarged views.

FIG. 1B is an enlarged view of the set of pixels CS. The set includes the red pixel R1, the green pixel G1, the blue pixel B1, and the white pixel W1 with photochromic film.

Figure 1C:
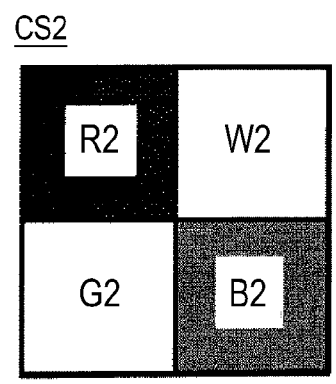

FIG. 1C is an enlarged view of the set of pixels CS2. The set includes the red pixel R2, the green pixel G2, the blue pixel B2, and the white pixel W2 without photochromic film.

In the embodiment, the sets of pixels CS1 and the sets of pixels CS2 are alternately arranged respectively in the horizontal direction and the vertical direction.

That is, in the configuration, the sets of pixels CS1 with photochromic film and the sets of pixels CS2 without photochromic film are alternately arranged with respect to each set of pixels including four pixels called Bayer arrangement of one red pixel R, two green pixels, and one blue pixel B.

As described above, in the configuration, the set of pixels includes one red pixel, one green, pixel, one blue pixel, and one white pixel, and a common photochromic film is formed with respect to each set of pixel.

Figure 2A:
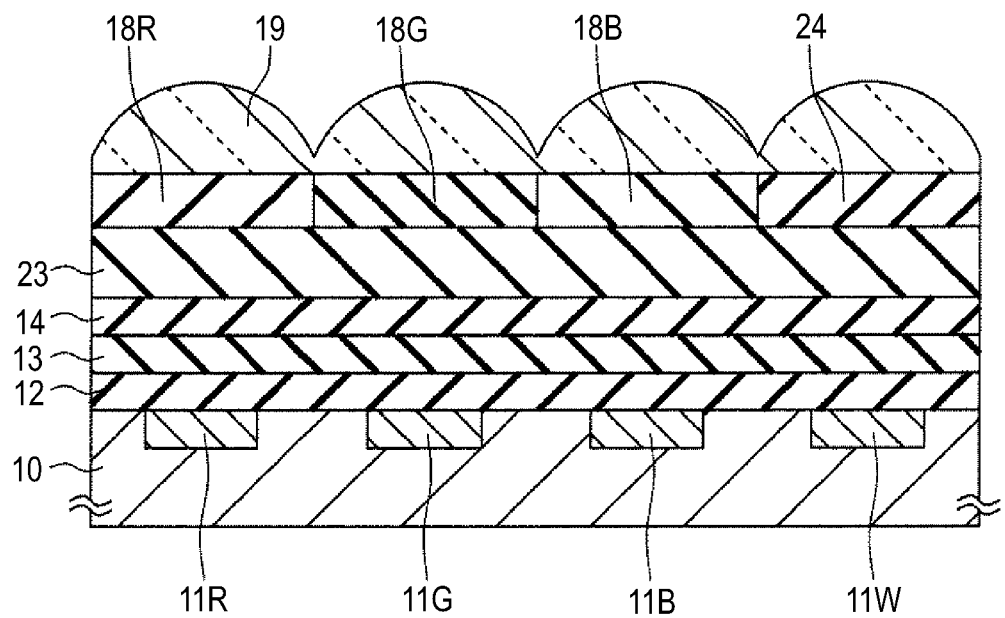
FIGS. 2A and 2B are schematic sectional views of the solid-state imaging device according to the first embodiment of the invention.
Figure 2B:
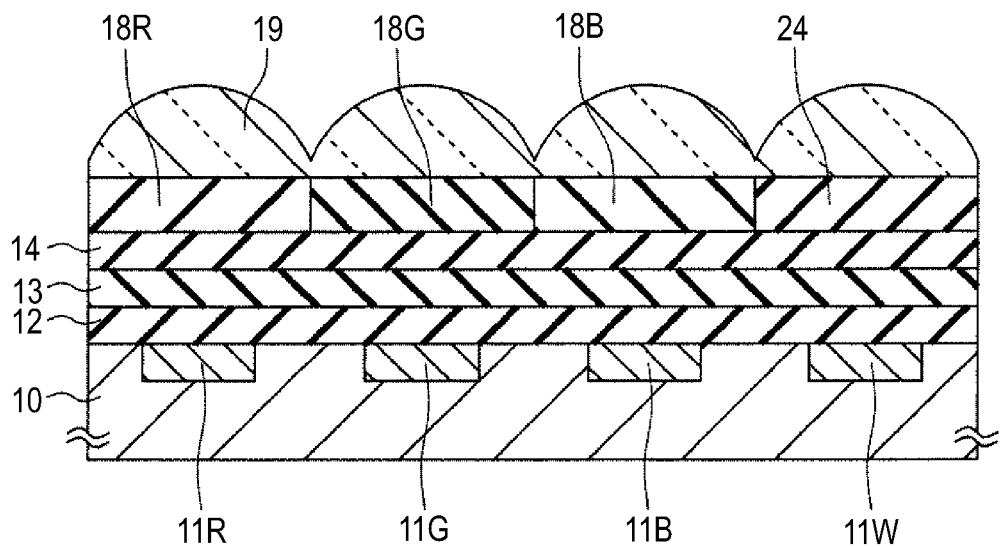

FIGS. 2A and 2B are schematic sectional views of the solid-state imaging device according to the first embodiment of the invention.

FIG. 2A is a sectional view in the set of pixels CS1, i.e., the red pixel R1, the green pixel G1, the blue pixel B1, and the white pixel W1.

For example, photodiodes 11R, 11G, 11B, 11W are formed in each of the red pixel, the green pixel, the blue pixel, and the white pixel in the sections of the respective pixels of the red pixels R1, the green pixels G1, the blue pixels B1, and the white pixels W1 arranged in a matrix on a semiconductor substrate 10.

For example, a first insulating film 12 containing a silicon oxide, a silicon nitride, a resin, or a laminated structure of them is formed on the entire surface of the semiconductor substrate 10 to cover the photodiodes 11R, 11G, 11B, 11W.

For example, a second insulating film 13 containing a silicon oxynitride is formed on the first insulating film 12.

For example, a third insulating film 14 containing a silicon nitride is formed on the second insulating film 13.

For example, a photochromic film 23 is stacked on the third insulating film 14.

The photochromic film 23 is provided in light incident paths to the photodiodes 11R, 11G, 11B, 11W, and contains a photochromic material having transmittance varying in response to incident light intensity in a predetermined wavelength region.

In the red pixel, a red color filter 18R is formed on the photochromic film 23.

In the green pixel, a green color filter 18G is formed on the photochromic film 23.

In the blue pixel, a blue color filter 18B is formed on the photochromic film 23.

In the white pixel, a white pixel material 24 is formed on the photochromic film 23, for example. The material of the white pixel is a polystyrene resin or an acrylic resin, for example, and transmits light in a visible light region.

For example, an on-chip lens 19 is formed on the color filters 18R, 18G, 18B and the white pixel material 24.

FIG. 2B is a sectional view in the set of pixels CS2, i.e., the red pixel R2, the green pixel G2, the blue pixel B2, and the white pixel W2.

The configuration is substantially the same as the configuration in FIG. 2A, however, different in that the photochromic film 23 is not formed.

Regarding the photochromic material, its light transmittance varies in response to incident light intensity in a predetermined wavelength region as described above.

For example, the photochromic film has light transmittance varying in response to incident light intensity in a visible light region, and the light transmittance in the visible light region has a higher characteristic when the amount of incident light is smaller than when the amount is larger. Further, for example, the light transmittance of the photochromic film in the visible light region continuously changes in response to the amount of incident light.

In the above described photochromic film, the light transmittance becomes lower when light is applied thereto and the reduction of the light transmittance is recovered to the original light transmittance when the light is blocked. A necessary period from blocking of the light to the recovery of the value of a half of the fluctuation range of the light transmittance is referred to as "half period".

In the embodiment, the half period of the light transmittance of the photochromic film is shorter than a period in which pixel signals obtained in pixels are read out with respect to all pixels, i.e., one frame.

For example, in the case where the frame rate of a solid-state imaging device is 60 fps, one frame is about 17 mS and, in this case, a photochromic material with a half period shorter than 17 mS is used.

As the material forming the photochromic film 23, for example, a hexaarylbisimidazole derivative may be used.

By appropriately changing the substituents, various absorption wavelength regions, response speeds, etc. may be adjusted.

For example, the following compound may preferably be used.

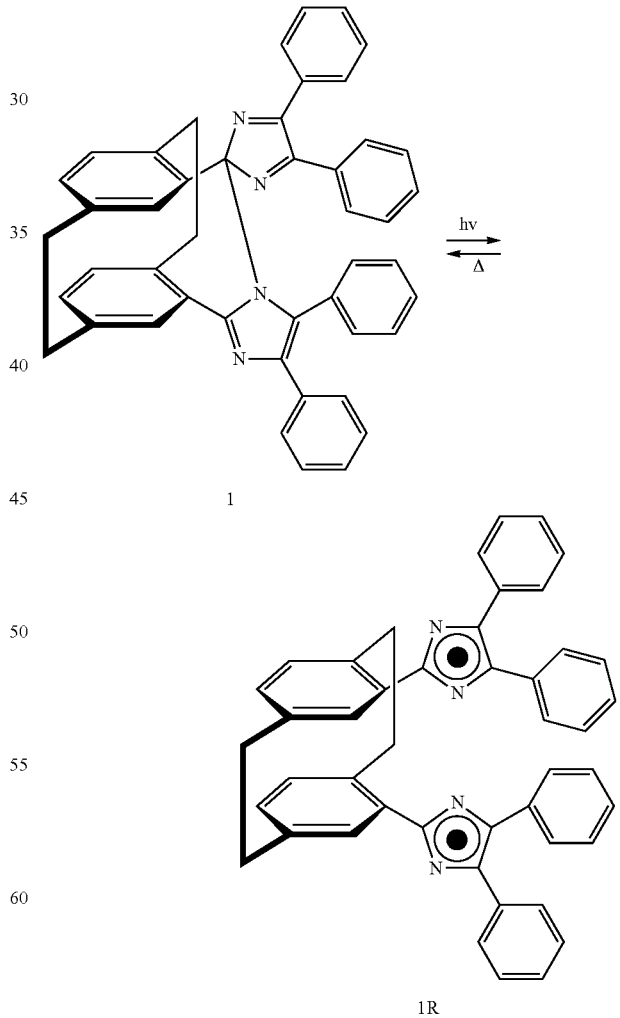

Figure 3A:
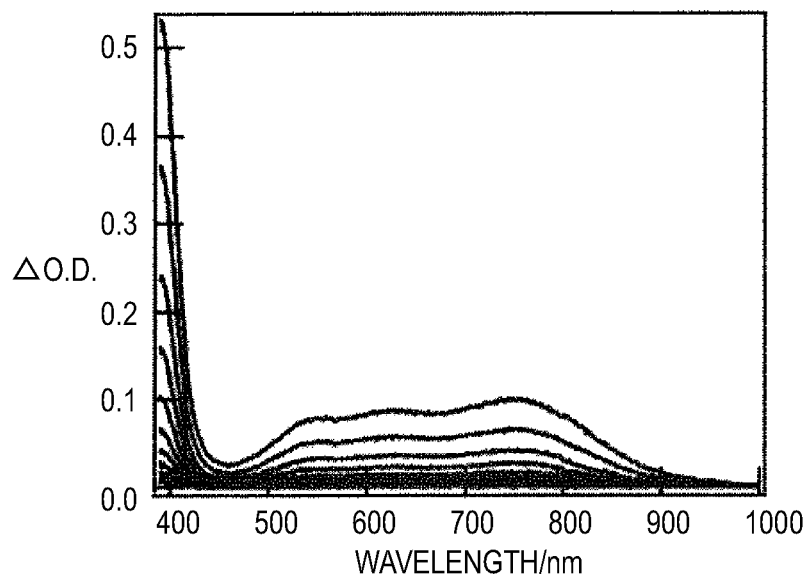
FIGS. 3A and 3B are graphs showing light transmittance characteristics of a photochromic material of photochromic films of the solid-state imaging device according to the first embodiment of the invention.

FIG. 3A shows temporal changes of ΔO.D. (optical density change) of the above hexaarylbisimidazole derivative when light is applied thereto and ΔO.D. (optical density change) when the light is blocked, corresponding to temporal changes of light absorption spectra. The intervals of spectra are 20 mS.

Figure 3B:
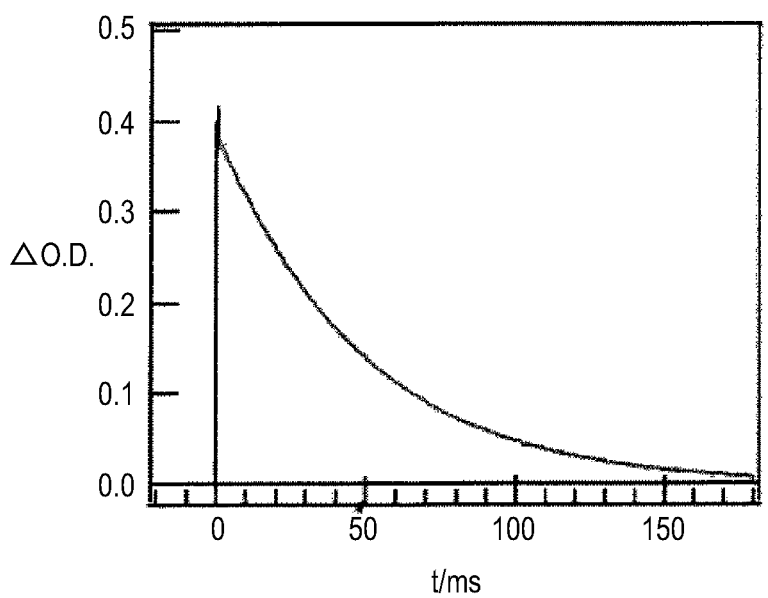

Further, FIG. 3B shows a temporal change of ΔO.D. at 400 nm and 25° C. The half time is about 33 mS and the light transmittance changes rapidly in response to light application, and thus, the dynamic range may be expanded without generation of unnaturalness as images.

Furthermore, for example, the following compound may preferably be used.

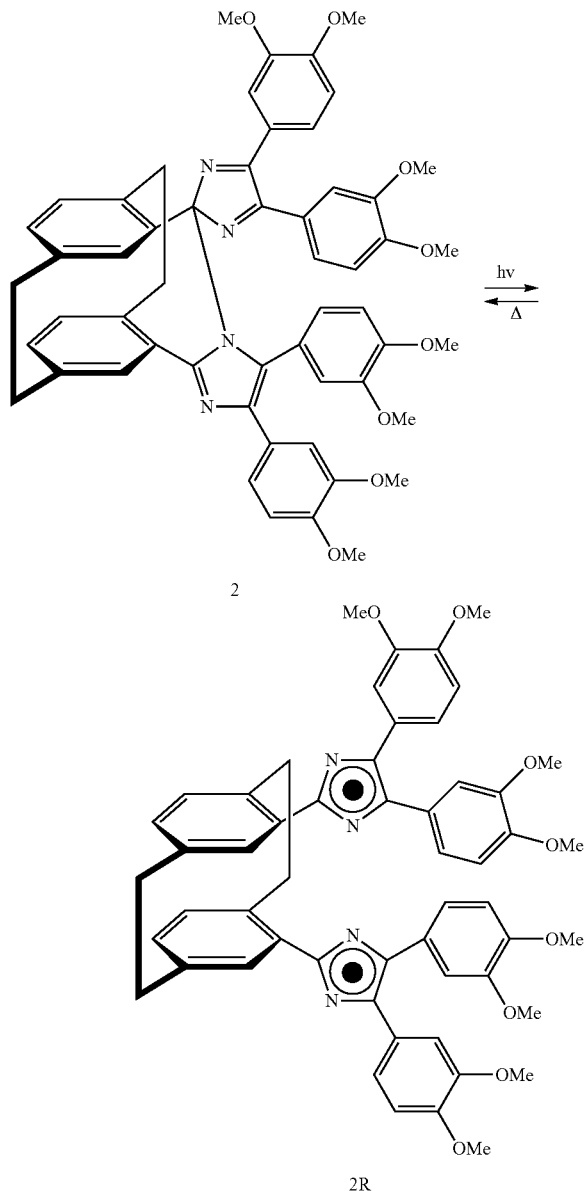

Figure 4A:
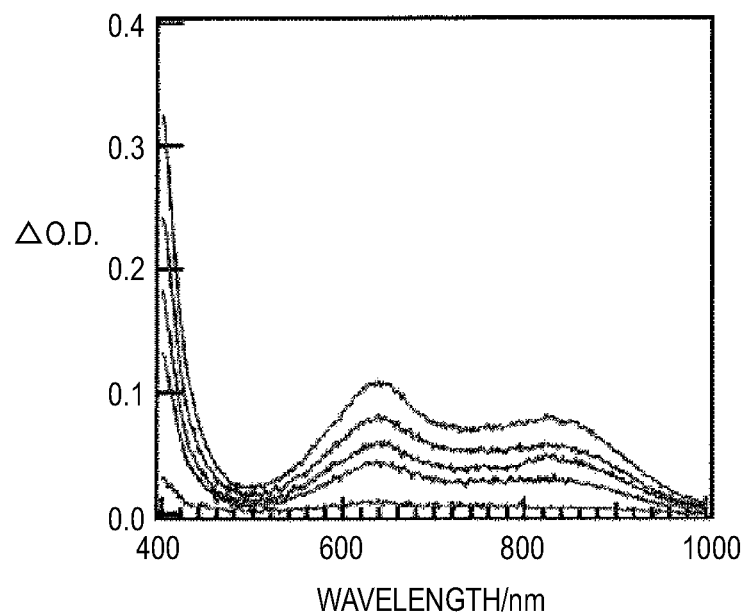
FIGS. 4A and 4B are graphs showing light transmittance characteristics of a photochromic material of the photochromic films of the solid-state imaging device according to the first embodiment of the invention.

FIG. 4A shows temporal changes of ΔO.D. (optical density change) of the above hexaarylbisimidazole derivative when light is applied thereto and ΔO.D. (optical density change) when the light is blocked, corresponding to temporal changes of light absorption spectra. The intervals of spectra are 20 mS.

Figure 4B:
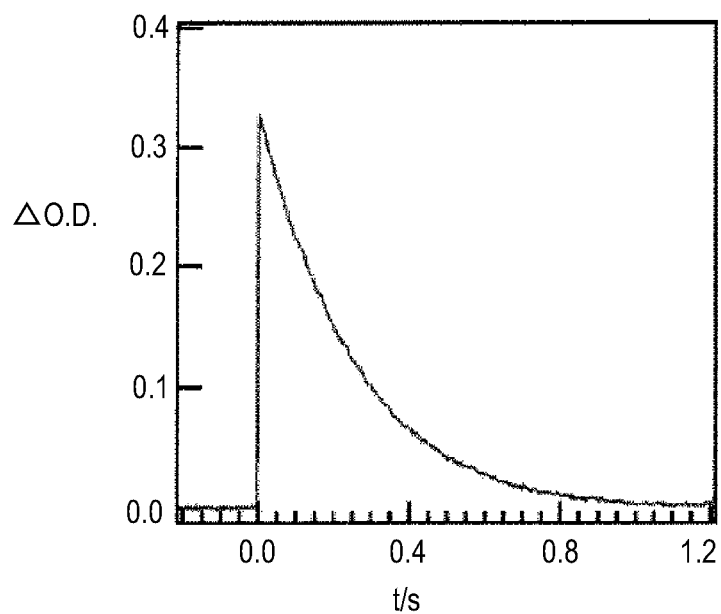

Further, FIG. 4B shows a temporal change of ΔO.D. at 400 nm and 25° C. The half time is about 173 mS and the light transmittance changes rapidly in response to light application, and thus, the dynamic range may be expanded without generation of unnaturalness as images.

The respective hexaarylbisimidazole derivatives are available as rapidly-switching photochromic dyes from KANTO CHEMICAL.

Further, for example, as a photochromic material for red pixel, by appropriately changing the substituents in the hexaarylbisimidazole derivatives, preferable absorption wavelength regions, response speeds, etc. may be adjusted.

Figure 5:
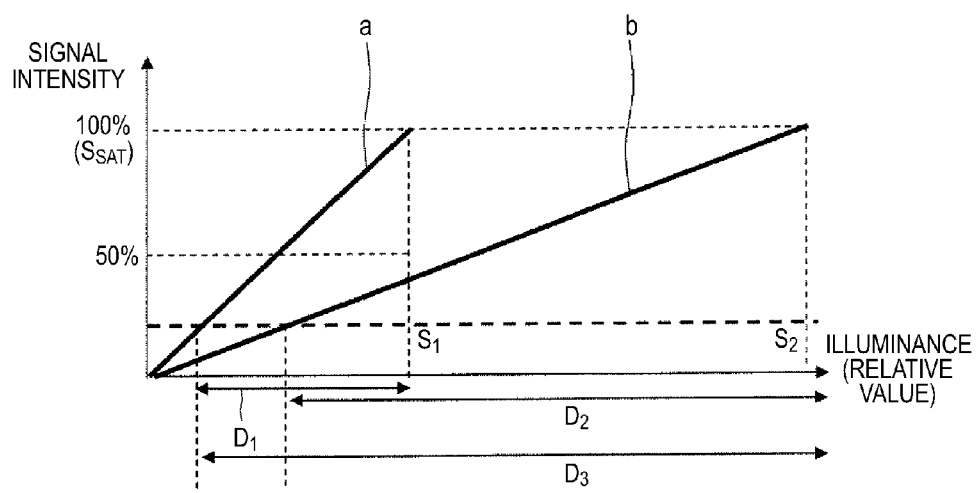
FIG. 5 is a schematic diagram for explanation of a reason for expansion of a dynamic range of the solid-state imaging device according to the first embodiment of the invention.

FIG. 5 is a schematic diagram for explanation of a reason for expansion of the dynamic range of the solid-state imaging device according to the embodiment.

FIG. 5 shows output signal intensity of a pixel with respect to illuminance of light applied to the pixel. In the drawing, a high-sensitivity signal-illuminance curve a of a pixel on which no photochromic film is formed and a low-sensitivity signal-illuminance curve b when the photochromic film is formed. It is assumed that the photochromic film has light transmittance of 50%.

As shown by the curve a in FIG. 5, when no photochromic film is formed, the signal intensity reaches 100% (saturation signal $S_{SAT}$) and is saturated at illuminance $S_1$. The dynamic range in the case of the curve a is shown by $D_1$.

However, in the curve b when the photochromic film is formed, the light transmittance becomes lower, and, for example, reaches 50% of the saturated signal intensity at the highest even at the light illuminance $S_1$. At illuminance $S_2$, the signal intensity reaches 100% (saturation signal $S_{SAT}$). However, there is noise actually, and the lower illuminance side signal is buried in the noise. The dynamic range in the case of the curve b is shown by $D_2$.

Then, the signals of the high-sensitivity pixel and the low-sensitivity pixel are synthesized. That is, the higher illuminance side output is used with respect to the curve a (dynamic range $D_1$) of the high-sensitivity signal and the lower illuminance side output is used with respect to the curve b of the low-sensitivity signal (dynamic range $D_2$) to complement each other. As a result, the dynamic range $D_3$ is formed.

The photochromic material is a hexaarylbisimidazole derivative, for example.

According to the solid-state imaging device of the embodiment, the light transmittance of the photochromic film varies in response to the amount of incident light, the light transmittance becomes lower at the higher illuminance and the light transmittance becomes higher at the lower illuminance. Accordingly, the amount of light with which the light signal is saturated becomes larger in the photodiode and the dynamic range at the higher illuminance side may be expanded.

The photodiode 11W of the white pixel W1 shown in FIG. 2A may have a configuration including a logarithmic conversion type signal readout part.

The logarithmic conversion type signal readout part has a configuration of combined MOS transistors, and may read out a logarithmically converted value using a characteristic of a subthreshold current when the gate voltage of the MOS transistor is equal to or less than a threshold value.

The white pixel W1 has a configuration that is easily saturated because of no color filter, and the dynamic range may further be expanded by combining it with the logarithmic conversion type signal readout part.

<Second Embodiment>
[Configuration of Solid-State Imaging Device]

The embodiment is a modified example of a pattern of sets of pixels CS1 with photochromic film and sets of pixels CS2 without photochromic film.

Figure 6:
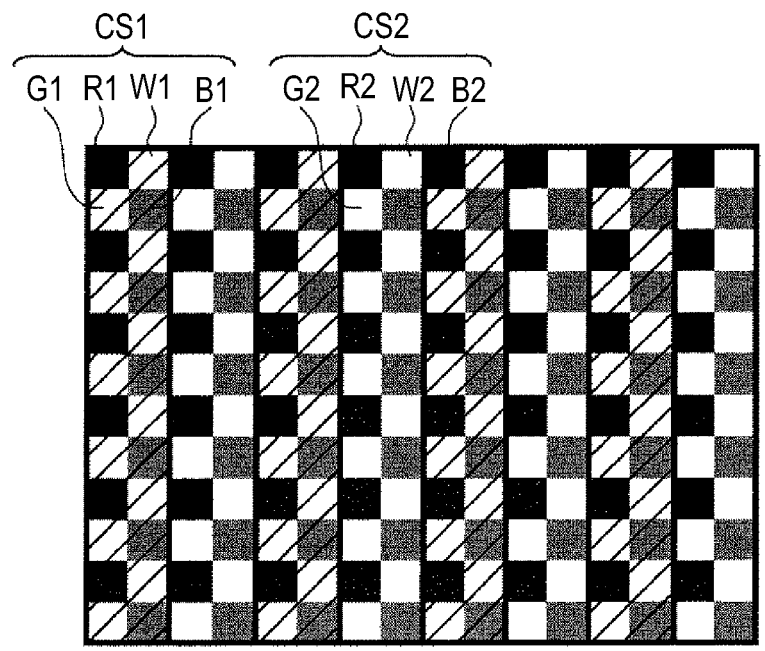
FIG. 6 is a schematic plan view showing a layout of a solid-state imaging device according to a second embodiment of the invention.

FIG. 6 is a schematic plan view showing a layout of the solid-state imaging device according to the embodiment.

In the embodiment, the sets of pixels CS1 with photochromic film and the sets of pixels CS2 without photochromic film are alternately arranged with respect to each set of pixels in two columns.

As described above, the sets of pixels include pixels arranged in plural columns in juxtaposition and a common photochromic film is formed with respect to each set of pixels.

Figure 7:
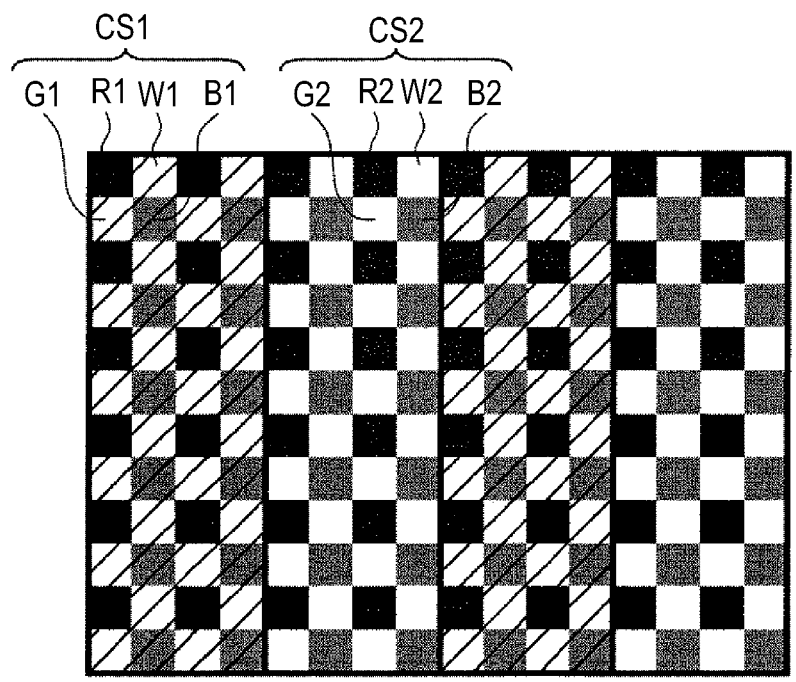
FIG. 7 is a schematic plan view showing a layout of the solid-state imaging device according to the second embodiment of the invention.

FIG. 7 is a schematic plan view showing a layout and a configuration of the solid-state imaging device according to the embodiment.

In the embodiment, sets of pixels CS1 with photochromic film and sets of pixels CS2 without photochromic film are alternately arranged with respect to each set of pixels in four columns.

As described above, the sets of pixels include pixels arranged in plural columns in juxtaposition and a common photochromic film is formed with respect to each set of pixels.

Figure 8:
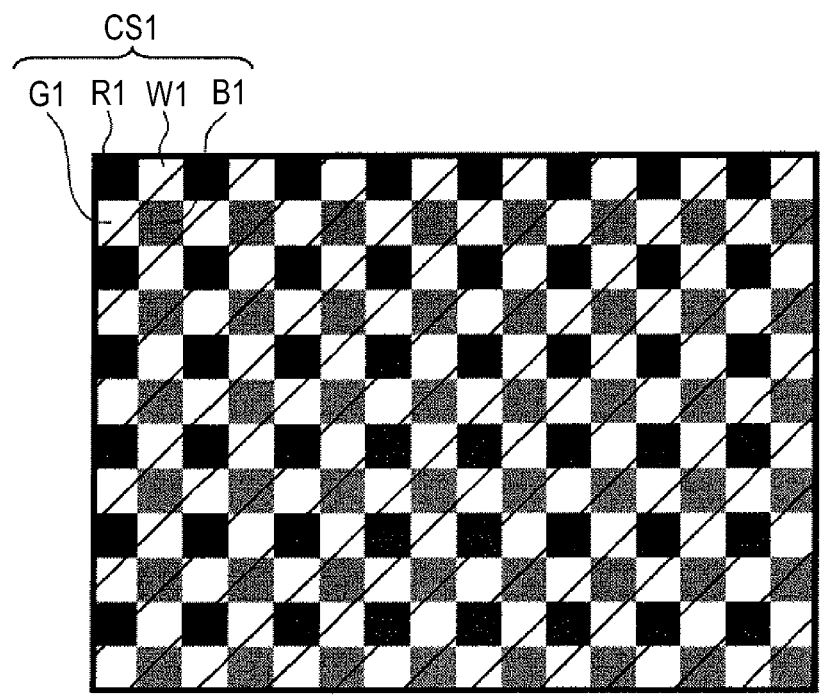
FIG. 8 is a schematic plan view showing a layout of the solid-state imaging device according to the second embodiment of the invention.

FIG. 8 is a schematic plan view showing a layout and a configuration of the solid-state imaging device according to the embodiment.

In the embodiment, sets of pixels CS1 with photochromic film are arranged in the entire region.

As described above, a common photochromic film is formed on all pixels in the light receiving surface.

Figure 9:
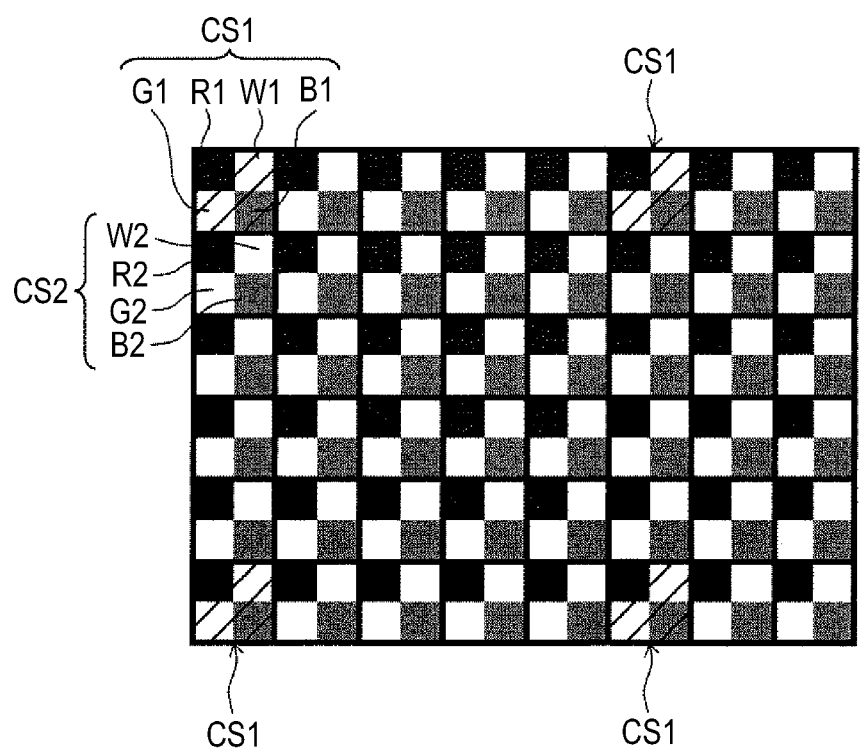
FIG. 9 is a schematic plan view showing a layout of the solid-state imaging device according to the second embodiment of the invention.

FIG. 9 is a schematic plan view showing a layout and a configuration of the solid-state imaging device according to the embodiment.

In the embodiment, sets of pixels CS1 with photochromic film are arranged in sets of pixels appropriately selected from all sets of pixels, and sets of pixels CS2 without photochromic film are arranged in the rest of the region.

The selection of the positions of the sets of pixels CS1 may appropriately be set and the positions may be selected according to the application of the solid-state imaging device.

According to the solid-state imaging device of the embodiment, the light transmittance of the photochromic film varies in response to the amount of incident light, and two kinds of high-sensitivity output and low-sensitivity output are obtained. The light transmittance becomes lower at the higher illuminance and the light transmittance becomes higher at the lower illuminance. Two kinds of low-sensitivity signal and high-sensitivity signal may be obtained. Therefore, the dynamic range may be expanded for the reason described in the first embodiment.

<Third Embodiment>
[Configuration of Solid-State Imaging Device]

The embodiment is a modified example of sets of pixels CS1 with photochromic film. In the embodiment, only white pixels have photochromic films.

Figure 10:
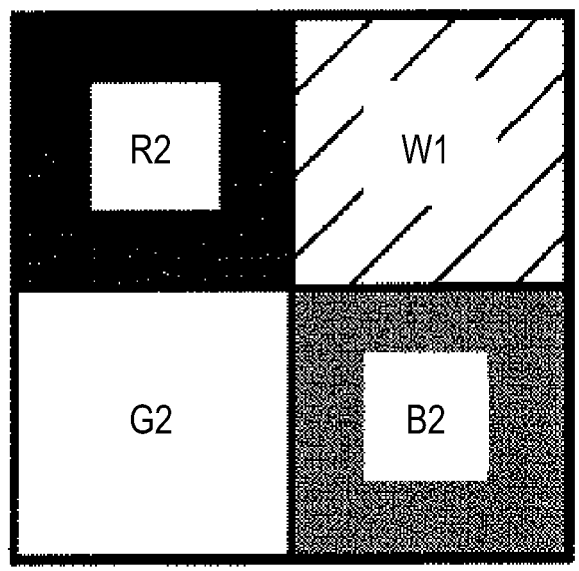
FIG. 10 is a schematic plan view showing a layout of a solid-state imaging device according to a third embodiment of the invention.

FIG. 10 is a schematic plan view showing a layout of the set of pixels CS1 of the solid-state imaging device according to the embodiment.

The set of pixels CS1 includes a white pixel W1 with photochromic film, and a red pixel R1, a green pixel G1, a blue pixel B1 without photochromic film.

The set of pixels CS2 includes a red pixel R2, a green pixel G2, a blue pixel B2, and a white pixel W2 without photochromic film.

The configuration is the same as that of the first embodiment except the above configuration.

In the embodiment, the sets of pixels CS1 and the sets of pixels CS2 are alternately arranged respectively in the horizontal direction and the vertical direction.

That is, in the configuration, the sets of pixels CS1 with photochromic film and the sets of pixels CS2 without photochromic film are alternately arranged with respect to each set of pixels including four pixels called Bayer arrangement of one red pixel R, two green pixels, and one blue pixel B.

According to the solid-state imaging device of the embodiment, the light transmittance of the photochromic film varies in response to the amount of incident light, and two kinds of high-sensitivity output and low-sensitivity output are obtained. The light transmittance becomes lower at the higher illuminance and the light transmittance becomes higher at the lower illuminance. Two kinds of low-sensitivity signal and high-sensitivity signal may be obtained. Therefore, the dynamic range may be expanded for the reason described in the first embodiment.

Since the photochromic film is a film for expanding the dynamic range, the red pixels, the green pixels, and blue pixels in which the saturation is signals are harder to occur than in the white pixels may include only pixels without photochromic film.

<Fourth Embodiment>
[Configuration of Solid-State Imaging Device]

The embodiment is a modified example of sets of pixels CS1 with photochromic film. In the embodiment, only white pixels have photochromic films.

Figure 11:
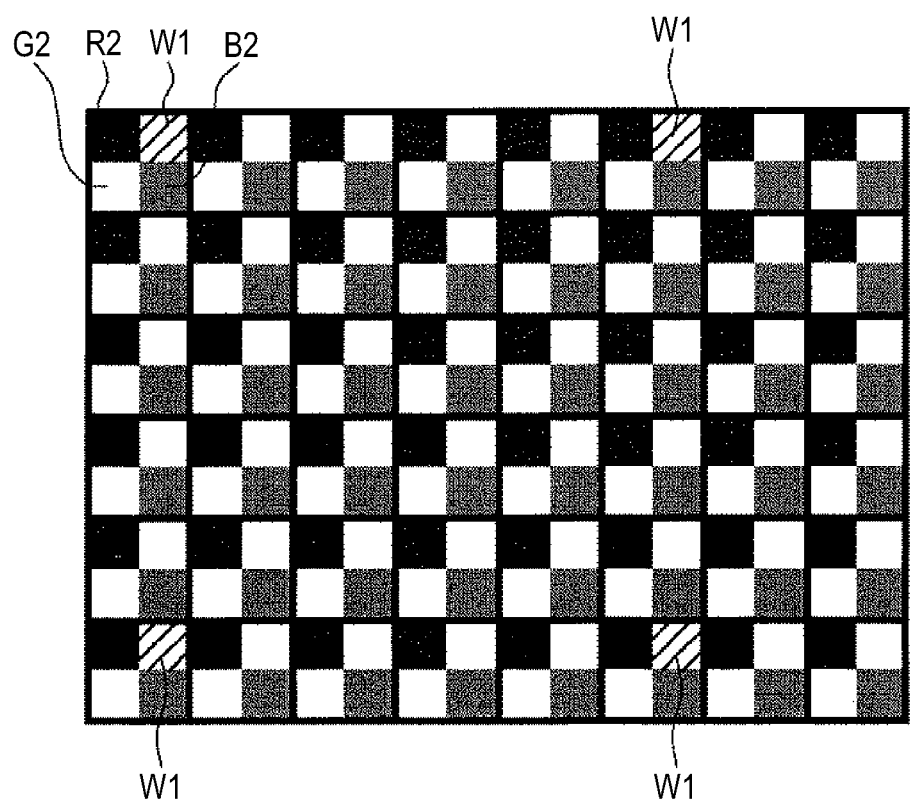
FIG. 11 is a schematic plan view showing a layout of a solid-state imaging device according to a fourth embodiment of the invention.

FIG. 11 is a schematic plan view showing a layout and a configuration of the solid-state imaging device according to the embodiment.

In the embodiment, the photochromic films are formed only on the white pixels forming the sets of pixels appropriately selected from all sets of pixels. No photochromic film is formed even on the white pixels in the rest of the region.

The selection of the positions of the sets of pixels CS1 may appropriately be set and the positions may be selected according to the application of the solid-state imaging device.

According to the solid-state imaging device of the embodiment, the light transmittance of the photochromic film varies in response to the amount of incident light, and two kinds of high-sensitivity output and low-sensitivity output are obtained. The light transmittance becomes lower at the higher illuminance and the light transmittance becomes higher at the lower illuminance. Two kinds of low-sensitivity signal and high-sensitivity signal may be obtained. Therefore, the dynamic range may be expanded for the reason described in the first embodiment.

For example, gamma correction processing and auto gain control processing are performed as signal processing in a signal processing part.

In the embodiment, the dynamic range may be expanded by signal processing of synthesizing signals of electric charge absorbed by the photochromic films and the output signals of pixel sensors without monitoring the potentials of the photochromic films.

The manner of the signal processing in the embodiment is a technique of obtaining an amount of light entering the photochromic material in advance and synthesizing it with the amount of light absorbed by the material with respect to the output signals from the sensors with reference to the amount of incident light.

The optical characteristics of the material of the photochromic film used in the embodiment have absorption of several percents in the visible region in a dark state. It is preferable to almost transmit the light, and, when the absorption is zero, the material is colored.

On the other hand, in a light state, the characteristics show absorption coefficient rising in a stroke. If the optical characteristics and the amount of incident light to the photodiode are known, the amount of light absorbed by the photochromic material may be obtained.

The sensor that monitors the amount of light entering the photochromic film is set by replacing at least one of the photodiodes formed on the substrate by a logarithmic sensor without color filter.

Given that the amount of light absorbed by the material is I, $I=I_0 \times t$. Here, $I_0$ is an amount of incident light and t is transmittance of the material.

As described above, the output signals are synthesized by performing signal processing of adding the amount of light absorbed by the material to the light intensity of the sensors. For the signal processing, for example, gamma correction processing and auto gain control processing may be used.

The gamma correction processing performs correction in a linear relationship when the relationship between the amount of light absorbed by the material and the transmittance of the material is nonlinear.

Further, the auto gain control processing performs gain adjustment of the sensors by holding the relationship between the amount of light absorbed by the material and the transmittance of the material in a lookup table format.

Further, the dynamic range may be expanded by synthesizing the white pixel signals as high-sensitive signals by signal processing.

There are plural white pixels within an angle of view, and there are two kinds of structures, a structure formed by removing color filters from the other pixel parts and a structure formed by removing color filters from the other pixels and mounting ND filters instead.

The ND filter has its transmittance set to a fraction of the dynamic range desired to be expanded. Then, of the two pixels, the amount of light entering the photochromic film is monitored by the white pixel without blackout or saturation.

As described above, the white pixel may be used as a pixel that gives an alarm of saturation in a light state.

The photodiode of the white pixel without the ND filter thereon may be a typical photodiode or a photodiode including a logarithmic conversion type readout part.

In the case where the amount of incident light does not exceed the typical saturated amount of light of the sensor, the logarithmic conversion type sensor is not exactly necessary.

The dynamic range of the solid-state imaging device in related art covers the range of 60 dB from a white light lamp to sunlight.

The white pixel accurately outputs a signal of weak light from the white light lamp to a candle of the range.

On the other hand, the pixel with ND filter accurately outputs a signal of light with higher brightness than that of sunlight.

In this manner, for example, the dynamic range may be expanded to 20 dB.

In the embodiment, the dynamic range to be expanded is 20 dB, and the transmittance of the ND filter is 1/20.

FIG. 5 is for schematic explanation of the dynamic ranges in the cases with and without ND filter, and, for example, the dynamic range in the case without ND filter is $D_1$ ($D_2$) and the dynamic range in the case with ND filter is $D_3$. Further, the dynamic range desired to be expanded is $D_3-D_1$ ($D_2$).

<Fifth Embodiment>
[Configuration of Solid-State Imaging Device]

Figure 12:
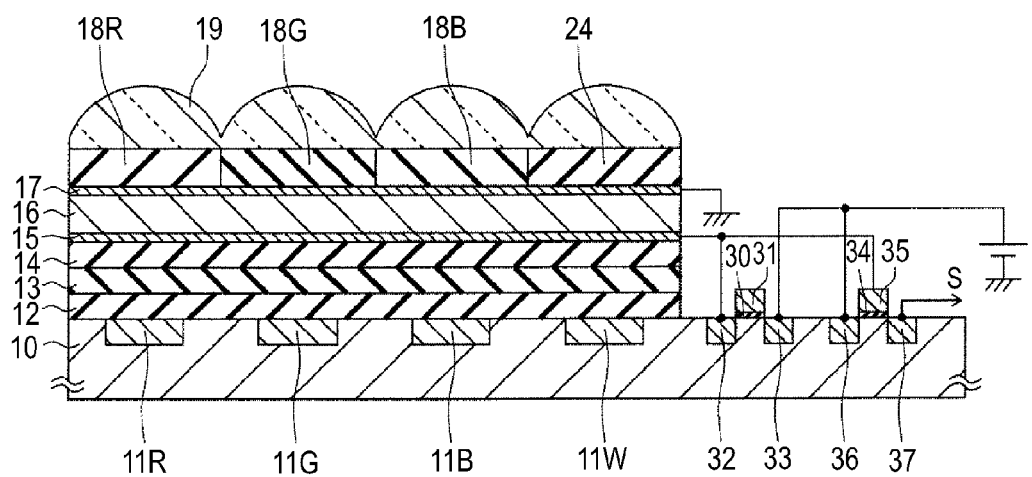
FIG. 12 is a schematic sectional view showing a solid-state imaging device according to a fifth embodiment of the invention.

FIG. 12 is a schematic sectional view of a solid-state imaging device according to the embodiment.

The embodiment is different from the first embodiment in that a light amount measurement part that measures an amount of light absorbed by the photochromic film is provided.

The configuration is substantially the same as that of the first embodiment except the difference.

For example, a lower electrode 15, a photochromic film 16, and an upper electrode 17 are stacked on the third insulating film 14.

The photochromic film 16 is provided in a light incident path for the photodiode 11, and contains a photochromic material with its transmittance varying in response to incident light intensity in a predetermined wavelength region.

The lower electrode 15 and the upper electrode 17 are transparent electrodes of ITO (indium tin oxide), for example.

For example, color filters 18R, 18G, 18B of the respective colors and a white pixel material 24 are formed on the upper electrode 17, and an on-chip lens 19 is formed thereon.

In the embodiment, as the photochromic film 16, a photochromic film that absorbs light and generates a photoelectron by the photoelectric effect is used. By measuring a current by the photoelectron or a voltage caused thereby, the amount of light may be measured.

For example, a gate insulating film 30 of a silicon oxide or the like, a gate electrode 31 of polysilicon or the like, are formed on a semiconductor substrate 10 in a region different from the pixel region, and source-drain 32, 33 are formed on the semiconductor substrate 10 in both side of the gate electrode 31.

Further, for example, similarly, a gate insulating film 34 of a silicon oxide or the like, a gate electrode 35 of polysilicon or the like, are formed on the semiconductor substrate 10, and source-drain 36, 37 are formed on the semiconductor substrate 10 in both side of the gate electrode 35.

As described above, MOS transistors are formed on the semiconductor substrate 10.

The lower electrode 15 is connected to the source-drain 32 and the gate electrode 35, and the upper electrode 17 is grounded.

Further, a predetermined voltage is applied to the source-drain 36, 37.

The MOS transistors form the light amount measurement part.

The source-drain 32 corresponds to a floating diffusion forming the pixel of the CMOS image sensor, for example.

The MOS transistor including the gate electrode 35 corresponds to an amplifier transistor that forms the pixel of the CMOS image sensor, for example.

That is, the photoelectron generated in the photochromic film 16 is accumulated in the floating diffusion as the source-drain 32. In response to the accumulated light charge, output S is output from the source-drain 37.

The obtained signal S is a signal obtained from measurement of the voltage caused by the photoelectron generated in the photochromic film 16, and the amount of light absorbed by the photochromic film 16 may be measured.

Further, the MOS transistor including the gate electrode 31 corresponds to a reset transistor that forms the pixel of the CMOS image sensor, for example.

For example, furthermore, by turning on the gate electrode 31, the light charge in the source-drain 32, i.e., the floating diffusion may be reset.

In addition, the light signal according to the amount of light measured in the light amount measurement part and the light signal obtained in the photodiode of each pixel may be combined and used as a pixel signal in the pixel. In this case, it is assumed that a signal processing part (not shown) for performing necessary processing on the light signal according to the amount of light measured in the light amount measurement part and the light signal obtained in the photodiode of each pixel is further provided. In the signal processing part, necessary arithmetic processing is performed on each signal.

For example, the respective signals are multiplied by a predetermined constant and a sum of them is calculated.

The embodiment has been described as a modified embodiment of the first embodiment, however, it may be applied to any one of the other embodiments.

According to the solid-state imaging device of the embodiment, the light transmittance of the photochromic film varies in response to the amount of incident light, the light transmittance becomes lower at the higher illuminance and the light transmittance becomes higher at the lower illuminance. Accordingly, the amount of light with which the light signal is saturated becomes larger in the photodiode and the dynamic range at the higher illuminance side may be expanded.

<Sixth Embodiment>

[Application to Electronic Equipment]

Figure 13:
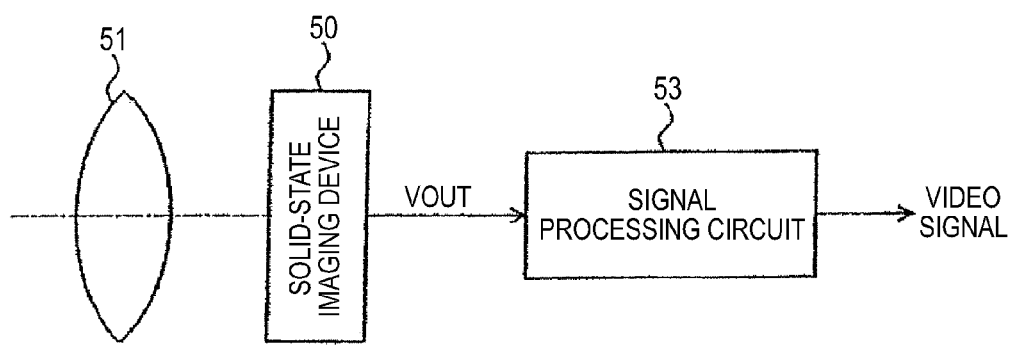
FIG. 13 is a schematic configuration diagram of electronic equipment according to a sixth embodiment of the invention.

FIG. 13 is a schematic configuration diagram of electronic equipment as electronic equipment according to the embodiment. The electronic equipment according to the embodiment is an example of video electronic equipment that can image still images or moving images.

The electronic equipment according to the embodiment has an image sensor (solid-state imaging device) 50, an optical system 51, a signal processing circuit 53, etc.

In the embodiment, as the image sensor 50, the solid-state imaging device according to the first embodiment is incorporated.

The optical system 51 focuses image light (incident light) from an object on an imaging surface of the image sensor 50. Thereby, the signal charge is accumulated within the image sensor 50 in a fixed period. The accumulated signal charge is extracted as an output signal Vout.

A shutter unit controls the light application period to the image sensor 50 and the light blocking period.

An image processing unit supplies drive signals for controlling the transfer operation of the image sensor 50 and the shutter operation of the shutter unit. Signal transfer of the image sensor 50 is performed by the drive signals (timing signals) supplied from the image processing unit. The signal processing circuit 53 performs various signal processing on the output signal Vout of the image sensor 50 and outputs it as a video signal. The video signal after signal processing is stored in a storage medium such as a memory or output on a monitor.

According to the electronic equipment according to the embodiment, for example, in electronic equipment having a solid-state imaging device that images color images in the generation particularly with a cell pitch of 3 μm or less, variations of light interference intensity of light entering the light receiving surface may be reduced and color irregularities may be suppressed.

In the above described embodiment, the case of application to the image sensor 50 in which unit pixels that sense the signal charge in response to the amount of visible light are arranged in a matrix has been explained as an example, however, the invention is not limited to the application to the image sensor 50. The invention may be applied to general column system solid-state imaging devices in which column circuits are arranged with respect to each pixel column of the pixel array part.

Further, the invention is not limited to the application to the solid-state imaging device that senses a distribution of the amount of incident visible light and images it as an image. The invention may be applied to general solid-state imaging devices that image distributions of infrared light, an X-ray, particles, or the like as images, and, in a broader sense, general solid-state imaging devices (physical quantity distribution sensing devices) that image distributions of other physical quantities of pressure, capacitance, or the like, such as a fingerprint detection sensor.

Furthermore, the invention is not limited to the application to the solid-state imaging device, but may be applied to electronic equipment having an imaging function such as digital still electronic equipment, video electronic equipment, a cellular phone, or the like. Note that the module form mounted on the electronic equipment, i.e., an electronic equipment module may be used as an imaging apparatus.

In an imaging apparatus such as video electronic equipment, digital still electronic equipment, and further, an electronic equipment module for mobile equipment of a cellular phone or the like, the image sensor 50 according to the above described embodiment that has been explained as the solid-state imaging device may be used.

The invention is not limited to the above explanation.

For example, the embodiments may be applied to either of a CMOS sensor or a CCD device.

In addition, various changes may be made without departing the scope of the invention.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
    a semiconductor substrate having a light receiving surface sectioned for red pixels, green pixels, blue pixels, and white pixels arranged in a matrix with photodiodes formed thereon;
    color filters formed on the semiconductor substrate in light incident paths to the photodiodes of respective formation regions of the red pixels, the green pixels, and the blue pixels and respectively transmitting light in red, green, and blue wavelength regions;
    and photochromic films formed on the semiconductor substrate in light incident paths to the photodiodes in formation regions of at least some of the white pixels, and containing a photochromic material having light transmittance varying in response to incident light intensity in a predetermined wavelength region,
    wherein sets of pixels containing white pixels on which the photochromic films are formed and sets of pixels containing white pixels on which no photochromic films are formed are arranged on the light receiving surface.

2. The solid-state imaging device according to claim 1, wherein the photochromic films are also formed on the semiconductor substrate in the light incident paths to the photodiodes of the respective formation regions of at least some of the red pixels, the green pixels, and the blue pixels.

3. The solid-state imaging device according to claim 1, wherein at least a first set of pixels includes one red pixel, one green pixel, one blue pixel, and one white pixel, and a common photochromic film is formed with respect to the at least first set of pixels.

4. The solid-state imaging device according to claim 1, wherein at least a first set of pixels includes pixels arranged in one column in juxtaposition, and a common photochromic film is formed with respect to the at least first set of pixels.

5. The solid-state imaging device according to claim 1, wherein at least a first set of pixels includes pixels arranged in plural columns in juxtaposition, and a common photochromic film is formed with respect to the at least first set of pixels.

6. The solid-state imaging device according to claim 1, wherein the photodiode in the white pixel with the photochromic film formed thereon has an output part that logarithmically converts and outputs a value of a light signal corresponding to light charge generated in the photodiode.

7. The solid-state imaging device according to claim 1, further comprising a light amount measurement part that measures an amount of light absorbed by the photochromic film.

8. The solid-state imaging device according to claim 7, further comprising a signal processing part that combines a light signal according to the amount of light measured in the light amount measurement part and the light signal obtained in the photodiode of each pixel.

9. The solid-state imaging device according to claim 7, further comprising a reset part that resets a light signal generated when the photochromic film absorbs light.

10. The solid-state imaging device according to claim 2, wherein the photochromic films are formed using different materials corresponding to wavelength regions transmitted through the color filters.

11. The solid-state imaging device according to claim 2, wherein the photochromic films are formed using the same material independent of wavelength regions transmitted through the color filters.

12. The solid-state imaging device according to claim 2, wherein the photochromic film and the color filter are formed as the same film.

13. The solid-state imaging device according to claim 8, wherein gamma correction processing and auto gain control processing are performed as signal processing in the signal processing part.

14. The solid-state imaging device according to claim 1, wherein the photochromic film has light transmittance that changes in response to incident light intensity in a visible light region.

15. The solid-state imaging device according to claim 1, wherein the light transmittance of the photochromic film in a visible light region is higher when the amount of incident light is smaller than when the amount is larger.

16. The solid-state imaging device according to claim 1, wherein the light transmittance of the photochromic film in a visible light region continuously changes in response to the amount of incident light.

17. The solid-state imaging device according to claim 1, wherein the photochromic material is a hexaarylbisimidazole derivative.

18. Electronic equipment comprising:
a solid-state imaging device;
an optical system that guides incident light to an imaging unit of the solid-state imaging device;
and a signal processing circuit that processes an output signal of the solid-state imaging device,
the solid-state imaging device including a semiconductor substrate having a light receiving surface sectioned for red pixels, green pixels, blue pixels, and white pixels arranged in a matrix with photodiodes formed thereon, color filters formed on the semiconductor substrate in light incident paths to the photodiodes of respective formation regions of the red pixels, the green pixels, and the blue pixels and respectively transmitting light in red, green, and blue wavelengths, and photochromic films formed on the semiconductor substrate in light incident paths to the photodiodes of formation regions of at least some of the white pixels, and containing a photochromic material having light transmittance varying in response to incident light intensity in a predetermined wavelength region,
wherein sets of pixels containing white pixels on which the photochromic films are formed and sets of pixels containing white pixels on which no photochromic films are formed are arranged on the light receiving surface.

* * * * *